United States Patent
Elian et al.

(10) Patent No.: US 9,332,330 B2
(45) Date of Patent: May 3, 2016

(54) SURFACE MOUNTABLE MICROPHONE PACKAGE, A MICROPHONE ARRANGEMENT, A MOBILE PHONE AND A METHOD FOR RECORDING MICROPHONE SIGNALS

(71) Applicant: Infineon Technologies AG, Neubiberg (DE)

(72) Inventors: Klaus Elian, Alteglofsheim (DE); Horst Theuss, Wenzenbach (DE); Thomas Mueller, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 50 days.

(21) Appl. No.: 13/947,930

(22) Filed: Jul. 22, 2013

(65) Prior Publication Data

US 2015/0024807 A1    Jan. 22, 2015

(51) Int. Cl.
  *H04R 11/04*  (2006.01)
  *H04R 1/04*  (2006.01)
  *H01L 29/84*  (2006.01)

(52) U.S. Cl.
  CPC ........... *H04R 1/04* (2013.01); *B81B 2201/0257* (2013.01); *H04R 2201/00* (2013.01); *H04R 2499/11* (2013.01)

(58) Field of Classification Search
  CPC ........... H04R 2201/003; H04R 19/005; H04R 2499/11; B81B 2201/0257
  USPC .......... 381/173–175, 113; 257/415–418, 704, 257/723, 724, 731, 782; 379/429, 428.01, 379/433.03
  See application file for complete search history.

(56) References Cited

U.S. PATENT DOCUMENTS

| | | |
|---|---|---|
| 5,970,159 A | 10/1999 | McIntosh |
| 6,108,415 A | 8/2000 | Andrea |
| 7,221,767 B2 | 5/2007 | Mullenborn et al. |
| 7,233,679 B2 | 6/2007 | Muthuswamy et al. |
| 7,657,025 B2 * | 2/2010 | Hsu .......... H04M 1/03 379/429 |
| 8,804,982 B2 | 8/2014 | Michel et al. |
| 2006/0140431 A1 | 6/2006 | Zurek |
| 2007/0047746 A1 | 3/2007 | Weigold et al. |
| 2008/0037768 A1 * | 2/2008 | Hsu et al. ...... 379/429 |
| 2008/0157238 A1 | 7/2008 | Hsiao |
| 2008/0217709 A1 | 9/2008 | Minervini et al. |
| 2008/0318640 A1 | 12/2008 | Takano et al. |
| 2010/0142325 A1 | 6/2010 | Altman et al. |
| 2010/0303274 A1 * | 12/2010 | Ryan ........ H04R 1/222 381/361 |
| 2011/0293104 A1 | 12/2011 | Saplakoglu |
| 2012/0250897 A1 | 10/2012 | Michel et al. |
| 2012/0288130 A1 | 11/2012 | Dehe |
| 2013/0088941 A1 | 4/2013 | Elian et al. |
| 2013/0156235 A1 | 6/2013 | Wickstrom |
| 2014/0254850 A1 | 9/2014 | Elian et al. |

OTHER PUBLICATIONS

Jung, E., et al., "Smart Sensor Systems—Packaging Technologies for Multi-Sensory Consumer Applications," Proceedings of the Sensor + Test Conference, D2.2, 2009, pp. 323-325.

* cited by examiner

*Primary Examiner* — Sunita Joshi
(74) *Attorney, Agent, or Firm* — Slater & Matsil, L.L.P.

(57) ABSTRACT

A surface mountable microphone package includes a first microphone and a second microphone. Furthermore, the surface mountable microphone package includes a first opening for the first microphone and a second opening for the second microphone. The first opening and the second opening are arranged on opposite sides of the surface mountable microphone package.

12 Claims, 2 Drawing Sheets

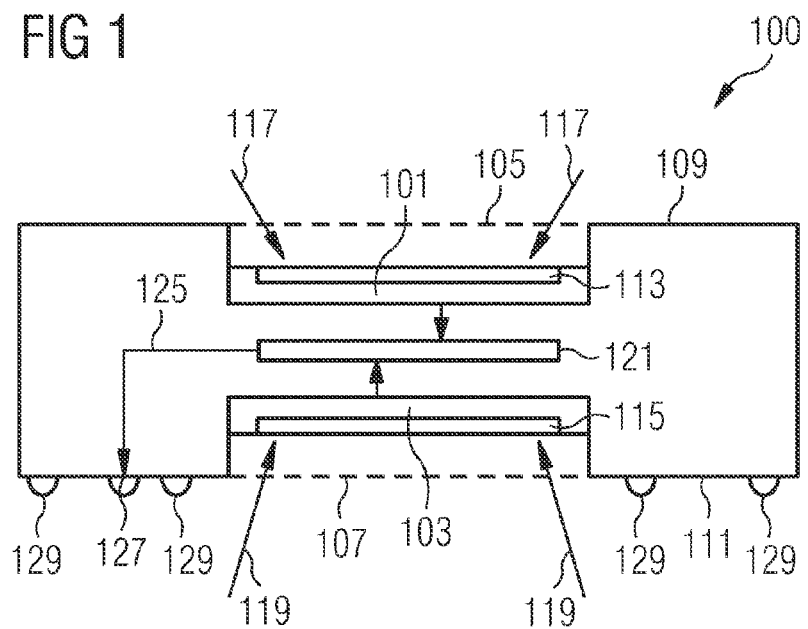
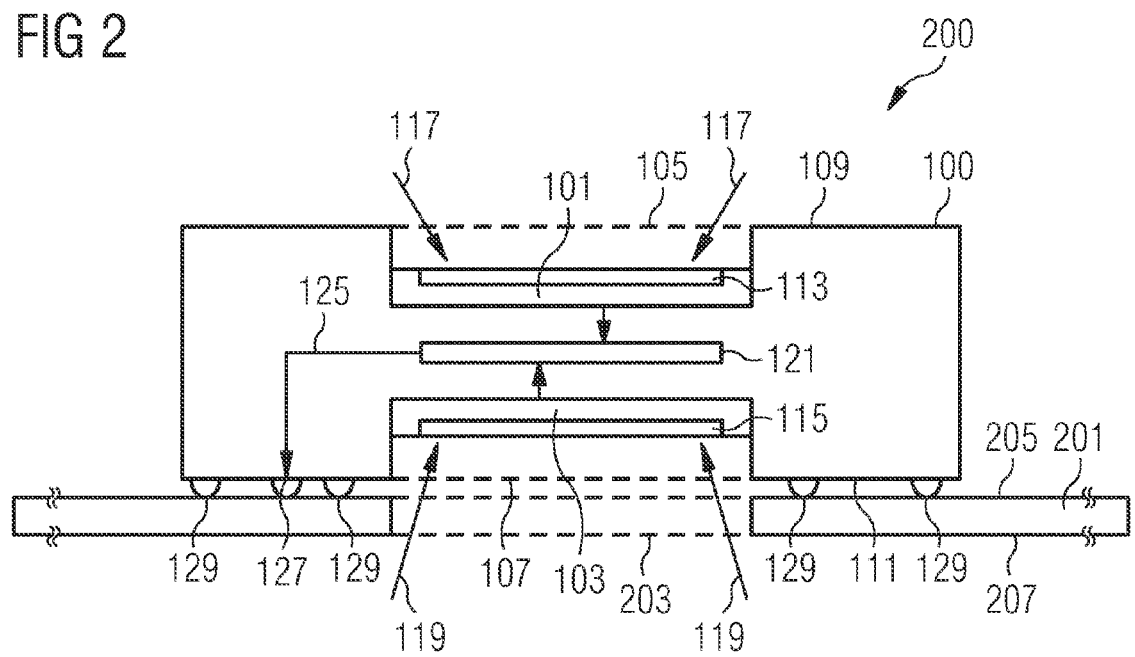

FIG 3

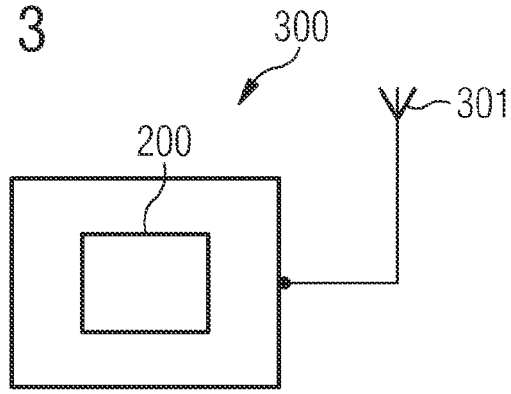

FIG 4

| |
|---|
| Recording a first microphone signal provided by a first microphone which is arranged in a surface mountable microphone package, the first microphone signal being based on sound waves entering a first opening of the surface mountable microphone package — 401 |
| ↓ |
| Recording a second microphone signal provided by a second microphone which is arranged in the surface mountable microphone package, the second microphone signal being based on sound waves entering a second opening of the surface mountable microphone package. — 403 |
| ↓ |
| Deriving a difference signal between the first microphone signal and the second microphone signal. — 405 |

SURFACE MOUNTABLE MICROPHONE PACKAGE, A MICROPHONE ARRANGEMENT, A MOBILE PHONE AND A METHOD FOR RECORDING MICROPHONE SIGNALS

TECHNICAL FIELD

Embodiments of the present invention relate to a surface mountable microphone package, a microphone arrangement, a mobile phone and a method for recording microphone signals.

BACKGROUND

In conventional smartphones or mobile phones two microphones are placed on different places on a circuit board of the mobile phone. Typically, one microphone is placed near to the opening for speech for recording a so-called use sound (like speech). Another microphone which is typically placed on the back side of the circuit board records the noise sounds behind the phone. Hence, the smartphone manufacturer has to assemble two different microphones on two different sides of a board of a smartphone.

SUMMARY OF THE INVENTION

Embodiments of the present invention relate to a surface mountable microphone package. The surface mountable microphone package comprises a first microphone and a second microphone. Furthermore, the surface mountable microphone package comprises a first opening for the first microphone and a second opening for the second microphone. The first opening and the second opening are arranged on opposite sides of the surface mountable microphone package.

Further embodiments of the present invention relate to a microphone arrangement comprising a circuit board and an above described surface mountable microphone package, which is mounted on the circuit board. The circuit board comprises a hole which is arranged adjacent to the second opening of the surface mountable microphone package such that the hole and the second opening are fluidically connected.

Further embodiments of the present invention relate to a mobile phone comprising such a microphone arrangement.

Further embodiments of the present invention relate to a method for recording microphone signals.

BRIEF DESCRIPTION OF THE DRAWINGS

Embodiments of the present invention will be described in more detail, in which:

FIG. 1 shows a surface mountable microphone package according to an embodiment of the present invention;

FIG. 2 shows a microphone arrangement comprising the surface mountable microphone package shown in FIG. 1 according to a further embodiment of the present invention;

FIG. 3 shows a mobile phone according to an embodiment of the present invention; and FIG. 4 shows a flow diagram of a method for recording microphone sounds according to a further embodiment of the present invention.

Before embodiments of the present invention are described in the following in more detail it is to be pointed out that in the figures the same or functionally equal elements are provided with the same reference numbers. Hence, descriptions provided for elements having the same reference numbers are mutually exchangeable.

DETAILED DESCRIPTION OF ILLUSTRATIVE EMBODIMENTS

FIG. 1 shows a block schematic diagram of a surface mountable microphone package 100 according to an embodiment of the present invention. The surface mountable microphone package 100 comprises a first microphone 101 and a second microphone 103. Furthermore, the surface mountable microphone package 100 comprises a first opening 105 for the first microphone 101 and a second opening 107 for the second microphone 103.

As can be seen from FIG. 1, the first opening 105 is arranged on a first side (e.g., a top side) 109 of the surface mountable microphone package 100 and the second opening 107 is arranged on a second side (e.g., a bottom side) 111 of the surface mountable microphone package 100. The first side 109 and the second side 111 are arranged opposite from each other or in other words are opposite sides of the surface mountable microphone package 100. As an example, the first side 109 can be a top side of the surface mountable microphone package 100 and the second side 111 can be a bottom side of the surface mountable microphone package 100.

It has been found that an improved surface mountable microphone package can be provided if two microphone units (the first microphone 101 and the second microphone 103) are arranged in a single surface mountable microphone package 100, as this brings for a manufacturer (for example, of mobile phones) the advantage that he only has to place one package on a circuit board instead of two different packages for the two microphones. Hence, the surface mountable microphone package 100 achieves on the one hand the recording of use signals (such as speech) and on the other hand the recording of noise signals within one single surface mountable microphone package 100. Furthermore, the footprint of the surface mountable microphone package 100 is typically smaller than the footprint of two single microphones placed on a circuit board. Hence, the surface mountable microphone package 100 also brings advantages regarding miniaturization.

Hence, it is an advantage of the surface mountable microphone package 100 that the first opening 105 (or the first sound inlet 105) and the second opening 107 (or the second sound inlet 107) are arranged on the opposing top side 109 and bottom side 111 of the surface mountable microphone package 100, as when mounting the surface mountable microphone package 100 on a circuit board, the manufacturer only has to provide a small sound hole in the board (which can be placed adjacent to the second opening 107) but still can detect sounds on both sides of the circuit board using only one single device (the surface mountable microphone package 100).

Further advantageous modifications of the surface mountable microphone package 100 will be described in the following.

As already described, typically it is sufficient to provide the first microphone 101 and the second microphone 103 in the surface mountable microphone package 100 as the combination of these two microphones 101, 103 enables the recording of both use sounds (such as speech) and noise sounds or background noise (which shall be filtered out of the use sounds). Hence, the surface mountable microphone package 100 may comprise only the two microphones 101, 103 and no further microphone.

Furthermore, the first microphone 101 and the second microphone 103 can be monolithically integrated.

According to further embodiments of the present invention the first microphone 101 may comprise a first single chip or die and the second microphone 103 may comprise a second single chip or die which are both arranged in the microphone package 100 (for example, opposing each other). Furthermore, the first chip and the second chip can be separated from each other (e.g., may comprise separate substrates). Hence, some embodiments provide a multiple die semiconductor microphone package 100.

Furthermore, the first microphone 101 can comprise a first diaphragm 113 which acts as the sound sensing element of the first microphone 101. Furthermore, the second microphone 103 can comprise a second diaphragm 115 which acts as the sound sensing element of the second microphone 103.

The first opening 105 is fluidically connected to the first diaphragm 113 of the first microphone 101 such that sound waves 117 (e.g., speech waves) entering the first opening 105 also hit the first diaphragm 113 and are recorded by the first microphone 101.

The second opening 107 is fluidically connected to the second diaphragm 115 of the second microphone 103 such that sound waves 119 (e.g., noise waves) entering the second opening 107 hit the second diaphragm 115 and are recorded by the second microphone 103.

Furthermore, the first opening 105 and the second opening 107 are fluidically separated from each other in the surface mountable microphone package 100. In other words, inside the surface mountable microphone package 100 there may be no fluidic connection between the first opening 105 and the second opening 107. Hence, it can be achieved that sound waves 117 which enter the first opening 105 (and which do not exceed a certain intensity threshold level) only hit the first diaphragm 113 and are only recorded by the first microphone 101 but not by the second microphone 103. Accordingly, it can be achieved that sound waves 119 which enter the second opening 107 (and which do not exceed a certain intensity threshold value) only hit the second diaphragm 115 and are only recorded by the second microphone 103 but not by the first microphone 101.

A main sound recording direction of the second microphone 103 is directed to the bottom side 111 of the surface mountable microphone package 100. In contrast to this, a main sound recording direction of the first microphone 101 is directed to the top side 109 of the surface mountable microphone package 100.

In other words, the first microphone 101 faces with its sensitive diaphragm 113 to the top side 109 of the surface mountable microphone package 100 and the second microphone 103 faces with its sound sensitive diaphragm 115 to the bottom side 111 of the surface mountable microphone package 100.

Furthermore, the first microphone 101 and the second microphone 103 can be semiconductor microphones and therefore the surface mountable microphone package 100 can also be a semiconductor surface mountable microphone package 100.

Furthermore, the surface mountable microphone package 100 can comprise a signal processing unit 121 which is connected to the first microphone 101 for receiving a first microphone output signal from the first microphone 101 and which is furthermore connected to the second microphone 103 for receiving a second microphone output signal from the second microphone 103.

The signal processing unit 121 may be implemented using a single chip or die but can also be implemented using a plurality of signal processing chips (for example, for each microphone 101, 103 a single signal processing chip).

The signal processing unit 121 can be configured to derive a difference signal 125 between the first microphone signal provided by the first microphone 101 and the second microphone signal provided by the second microphone 103. Furthermore, the signal processing unit 121 can be configured to provide the difference signal 125 as an output signal of the signal processing unit 100, for example, at an output terminal 127 of the surface mountable microphone package 100.

The difference signal 125 may be derived, for example, by subtracting the second microphone signal from the first microphone signal or by subtracting the first microphone signal from the second microphone signal. In general, it could be said that the difference signal 125 is derived by subtracting the microphone signal which comprises the noise sounds from the microphone signal which comprises the speech sounds, to filter out the noise sounds.

Hence, with the surface mountable microphone package 100 an integrated miniaturized semiconductor microphone can be realized, which can detect background noise and can even remove such background noise within a single surface mountable microphone package 100.

Hence, the difference signal 125 is the optimized use signal which is free of background noise or background sounds. Furthermore, the surface mountable package 100 can comprise on at least one of the sides 109/111 of the surface mountable microphone package 100 on which the first opening 105 and the second opening 107 are arranged an assembling terminal 129 for an assembly of the surface mountable microphone package 100 to a circuit board (such as a printed circuit board).

In the example shown in FIG. 1 four of such assembling terminals 129 are shown. Nevertheless, the number of such assembling terminals 129 can vary and may be chosen in dependence on the use case of the surface mountable microphone package 100. As an example, such assembling terminals 129 may be contact pads for being soldered to a circuit board and may have further the function of providing signals to the surface mountable package 100 or from the surface mountable package 100 to the circuit board. Furthermore, the output terminal 127 may also be such an assembling terminal at which also the difference signal 125 is provided.

FIG. 2 shows a microphone arrangement 200 according to a further embodiment of the present invention.

The microphone arrangement 200 comprises the surface mountable microphone package 100 shown in FIG. 1 and furthermore, a circuit board 201 (such as a printed circuit board 201). The surface mountable microphone package 100 is arranged on a top side 205 on the circuit board 201, for example by soldering the surface mountable microphone package 100 using the assembling terminals 127, 129 to the circuit board 201.

As can be seen in FIG. 2, the circuit board 201 comprises a hole or opening 203 which is arranged adjacent to the second opening 107. Hence, the sound waves 119 which pass through the hole 203 of the circuit board 201 also pass through the second opening 107 and hit the second microphone 103. Hence, the hole 203 in the circuit board 201 and the second opening 107 are fluidically connected.

Furthermore, as can be seen from FIG. 2 the second opening 107 and the hole 203 aligned to each other in an overlapping manner. Hence, the sound waves 119 coming from a bottom side 207 of the circuit board 201 which is opposite to the top side 205 of the circuit board 201 can pass through the hole 203 and hit the second microphone 103 without any additional deflection. Sound waves 117 coming from the top side 205 onto which the surface mountable microphone package 100 is arranged directly pass through the first opening 105 and hit the first microphone 101.

Hence, as the sound openings 105, 107 are arranged on the top side 109 and the bottom side 111 of the package 100, it can be achieved that when using a typical surface mountable device assembly technique sounds from both sides of the circuit board 201 can be recorded without any problems and without any deflection of the noises.

As can be seen, the only thing a manufacturer has to ensure is that the circuit board 201 has the hole 203 which allows the sound waves 119 coming from the bottom side 207 of the circuit board 201 to pass through the hole 203 and hit the second microphone 103.

Furthermore, FIG. 3 shows a mobile phone 300 according to a further embodiment of the present invention. The mobile phone 300 comprises the microphone arrangement 200 shown in FIG. 2 and an antenna 301. The antenna 301 may be configured to transmit use signals (such as the difference signal 125) provided by the microphone arrangement 200.

By having the microphone arrangement 200 in the mobile phone 300, a production effort to be spent to produce the mobile phone 300 can be reduced when compared to conventional microphones in which two different microphones with two different packages are placed on a circuit board of the mobile phone 300, as in with the microphone arrangement 200 it is sufficient to place one single surface mountable microphone package 100 on the circuit board 201 of the mobile phone 300. But one still has the possibility of on the one hand recording use signals (such as speech) and on the other hand eliminating noise sounds like background noise.

FIG. 4 shows a method 400 for recording microphone signals according to an embodiment of the present invention.

The method 400 comprises a step 401 of recording a first microphone signal provided by a first microphone (such as the first microphone 101) which is arranged in a surface mountable microphone package (such as the surface mountable microphone package 100). The first microphone signal is based on sound waves (such as the sound wave 117) entering a first opening (such as the first opening 105) of the surface mountable microphone package.

Furthermore, the method 400 comprises a second step 403 of recording a second microphone signal provided by a second microphone (such as the second microphone 103) arranged in the surface mountable microphone package. The second microphone signal is based on sound waves (such as the sound wave 119) entering a second opening (such as the second opening 107) of the surface mountable microphone package.

Furthermore, the first opening and the second opening are arranged on opposite sides (for example, on the sides 109 and 111) of the surface mountable microphone package.

The method 400 can be performed, for example, using the surface mountable microphone package 100.

Furthermore, the method 400 can comprise a step 405 of determining a difference signal (such as the difference signal 125) between the first microphone signal and the second microphone signal.

As an example, the difference signal is the optimized use signal which is free of background noises.

The method 400 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example, a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example, via the Internet.

A further embodiment comprises a processing means, for example, a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A microphone arrangement comprising:
   a circuit board; and
   a surface mountable microphone package mounted on the circuit board, the surface mountable microphone package comprising:
   a first microphone;
   a second microphone;
   a first opening configured to receive sound waves to be recorded by the first microphone; and
   a second opening configured to receive sound waves to be recorded by the second microphone, the second opening being separate from the first opening,
   wherein the first opening and the second opening are arranged on opposite sides of the surface mountable microphone package,
   wherein the first microphone and the second microphone are stacked above one another between a first side of the surface mountable microphone package and a second side of the surface mountable microphone package, the second side being opposite to the first side, and
   wherein the first opening is provided on the first side of the surface mountable microphone package, and the second opening is provided on the second side of the surface mountable microphone package,
   wherein the circuit board comprises an opening arranged adjacent to the second opening of the surface mountable microphone package such that the opening of the circuit board and the second opening of the surface mountable microphone package are fluidically connected with each other.

2. The microphone arrangement according to claim 1, wherein the surface mountable microphone package comprises no further microphone inside the surface mountable microphone package.

3. The microphone arrangement according to claim 1, wherein the first microphone and the second microphone are monolithically integrated together.

4. The microphone arrangement according to claim 1, wherein the first microphone comprises a first chip and the second microphone comprises a second chip, and wherein the first chip of the first microphone and the second chip of the second microphone are separated from each other.

5. The microphone arrangement according to claim 1, wherein the first opening is fluidically connected to a first diaphragm of the first microphone such that sound waves entering the first opening are recorded by the first microphone, and wherein the second opening is fluidically connected to a second diaphragm of the second microphone such that sound waves entering the second opening are recorded by the second microphone.

6. The microphone arrangement according to claim 1, wherein the first opening and the second opening are fluidically separated from each other in the surface mountable microphone package.

7. The microphone arrangement according to claim 1, further comprising a signal processing unit connected to the first microphone and configured to receive a first microphone output signal from the first microphone, and connected to the second microphone and configured to receive a second microphone output signal from the second microphone, wherein the signal processing unit is sandwiched between the first microphone and the second microphone.

8. The microphone arrangement according to claim 7, wherein the signal processing unit is configured to derive a difference signal between a first microphone signal and a second microphone signal and to provide the difference signal as an output signal of the surface mountable microphone package.

9. The microphone arrangement according to claim 1, wherein the microphones are semiconductor microphones and the surface mountable microphone package is a semiconductor surface mountable microphone package.

10. The microphone arrangement according to claim 1, wherein on at least one of the sides of the surface mountable microphone package on which the first opening or the second opening is arranged, an assembling terminal for assembly of the surface mountable microphone package to a circuit board is arranged.

11. The microphone arrangement according to claim 1, wherein the second opening of the surface mountable microphone package and the opening of the circuit board are aligned to each other in an overlapping manner.

12. A mobile phone comprising:
   the microphone arrangement according to claim 1; and
   an antenna.

* * * * *